(12) United States Patent
Morvany

(10) Patent No.: US 11,502,635 B2
(45) Date of Patent: Nov. 15, 2022

(54) SYSTEM FOR CONTROLLING A SWITCH AND SWITCHING ARM

(71) Applicant: Valeo Equipements Electriques Moteur, Creteil (FR)

(72) Inventor: Romuald Morvany, Creteil (FR)

(73) Assignee: Valeo Equipements Electriques Moteur, Creteil (FR)

( * ) Notice: Subject to any disclaimer, the term of this patent is extended or adjusted under 35 U.S.C. 154(b) by 36 days.

(21) Appl. No.: 17/256,465

(22) PCT Filed: May 28, 2019

(86) PCT No.: PCT/EP2019/063804
§ 371 (c)(1),
(2) Date: Dec. 28, 2020

(87) PCT Pub. No.: WO2020/001900
PCT Pub. Date: Jan. 2, 2020

(65) Prior Publication Data
US 2021/0184614 A1 Jun. 17, 2021

(30) Foreign Application Priority Data
Jun. 28, 2018 (FR) ...................................... 1855893

(51) Int. Cl.
*H03K 3/12* (2006.01)
*H02P 27/06* (2006.01)
(Continued)

(52) U.S. Cl.
CPC .............. *H02P 27/06* (2013.01); *H02M 1/08* (2013.01); *H03K 17/6871* (2013.01)

(58) Field of Classification Search
CPC ...... H02P 27/06; H02M 1/08; H03K 17/6871; H03K 17/166; H02J 7/00; G04G 19/06
See application file for complete search history.

(56) References Cited

U.S. PATENT DOCUMENTS 4,123,779 A 10/1978 Goldschmidt
2012/0126859 A1* 5/2012 Kawamoto ............ H03K 3/012
327/108
(Continued)

FOREIGN PATENT DOCUMENTS

FR 3047854 A1 8/2017
JP S5851793 A 3/1983
(Continued)

OTHER PUBLICATIONS

International Search Report with Written Opinion in correspondingn International Application No. PCT/EP2019/063804, dated Jul. 11, 2019 (10 pages).
(Continued)

*Primary Examiner* — Cortez M Cook
(74) *Attorney, Agent, or Firm* — Osha Bergman Watanabe & Burton LLP

(57) ABSTRACT

The control system comprises an amplifier (264; 266) designed to receive an input control signal (cmd*; $\overline{\text{cmd}}$*), in order to amplify the input control signal (cmd*; $\overline{\text{cmd}}$*) so as to obtain an output control signal (CMD*; $\overline{\text{CMD}}$*) and to apply the output control signal (CMD*; $\overline{\text{CMD}}$*) to the switch (222; 224) in order to either open or close the switch (222; 224), the amplifier (264; 266) having two, positive and negative, supply terminals intended to receive a supply voltage.
It moreover comprises an inhibiting device (310; 314) for the amplifier (264; 266) designed to lower the supply voltage on receiving what is referred to as a total inhibit control (INHIB_T) so that the output control signal (CMD*; $\overline{\text{CMD}}$*) keeps the switch (222; 224) open irrespective of the input control signal (cmd*; $\overline{\text{cmd}}$*).

9 Claims, 2 Drawing Sheets

(51) Int. Cl.
*H02M 1/08* (2006.01)
*H03K 17/687* (2006.01)

(56) References Cited

U.S. PATENT DOCUMENTS

| | | | |
|---|---|---|---|
| 2014/0217950 A1* | 8/2014 | Watanabe | G04G 19/06 323/282 |
| 2016/0254689 A1* | 9/2016 | Lee | H02J 7/00 320/107 |
| 2016/0276956 A1 | 9/2016 | Suzuki | |

FOREIGN PATENT DOCUMENTS

| | | |
|---|---|---|
| JP | 2004-040470 A | 2/2004 |
| JP | 2013-219874 A | 10/2013 |

OTHER PUBLICATIONS

Office Action issued in corresponding Japanese Patent Application No. 2020-572787, dated Feb. 15, 2022 (5 pages).

\* cited by examiner

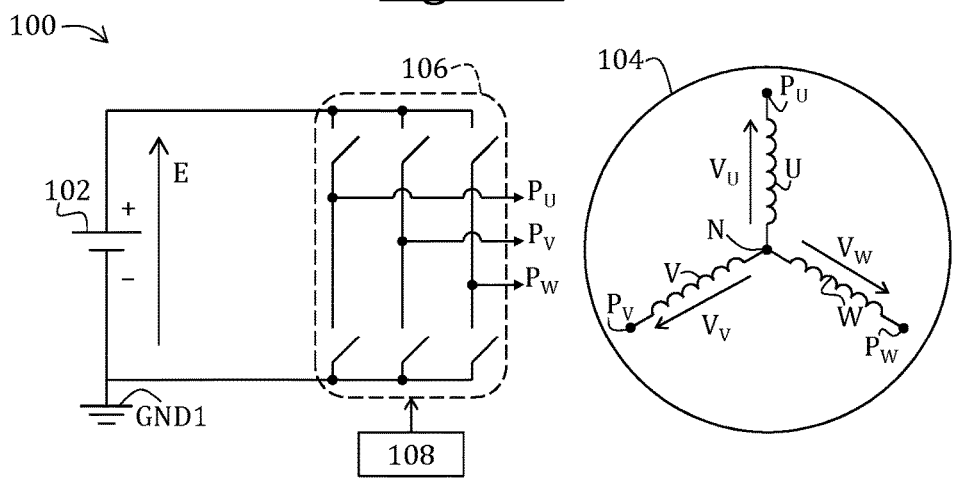
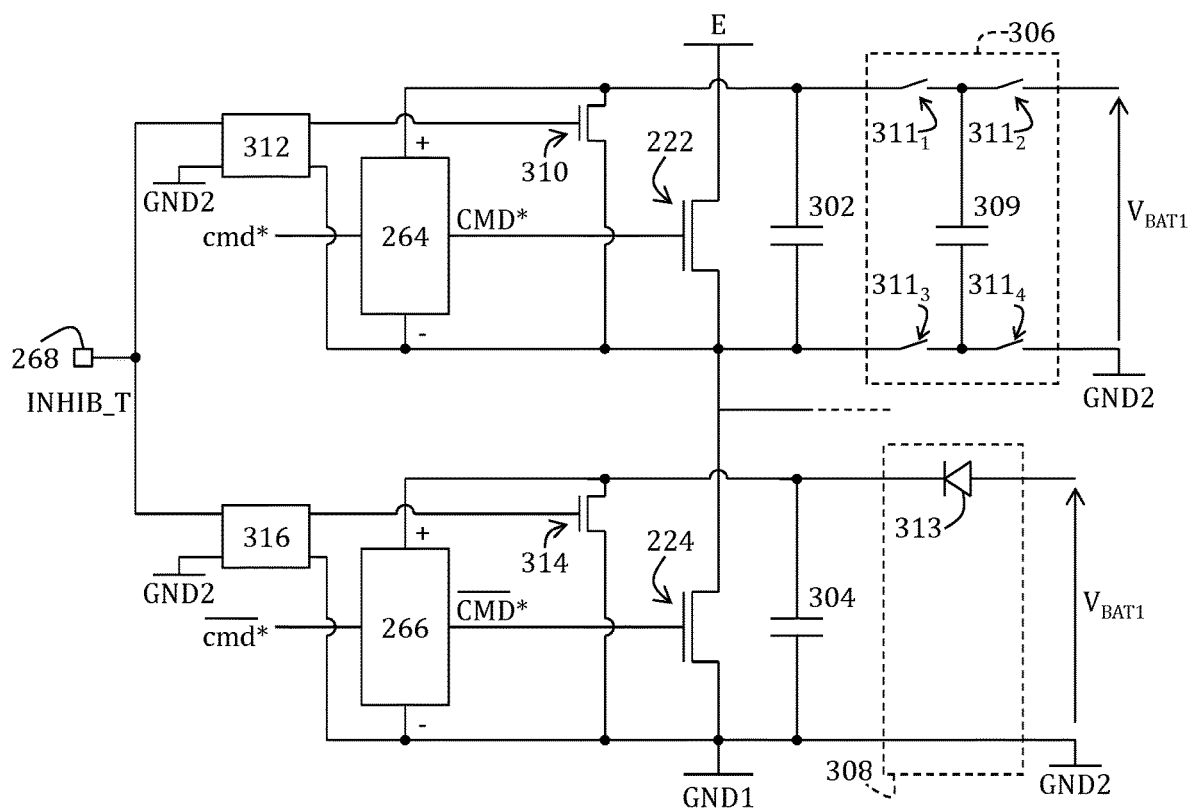

SYSTEM FOR CONTROLLING A SWITCH AND SWITCHING ARM

TECHNICAL FIELD

The present invention concerns a control system for a switch and a switching arm.

TECHNOLOGICAL BACKGROUND

It is known practice to use a control system for a switch, of the type comprising an amplifier designed to receive an input control signal, in order to amplify the input control signal so as to obtain an output control signal and to apply the output control signal to the switch in order to either open or close the switch, the amplifier having two, positive and negative, supply terminals intended to receive a supply voltage.

A control system of the aforementioned type is used for example in order to control the two switches of a switching arm of a voltage converter connected to a rotating electrical machine.

In the control system of the aforementioned type, the open or closed state of the switch is defined by the input control signal.

Thus, in the event of a fault in the device generating the input control signal, it is no longer possible to control the state of the switch. In the case of the switching arm, it is therefore no longer possible to open the two switches so as to put the rotating electrical machine into a safe state.

The aim of the invention is to overcome at least some of the aforementioned problems.

SUMMARY OF THE INVENTION

To this end, a control system of the aforementioned type is proposed, characterized in that it moreover comprises an inhibiting device for the amplifier designed to lower the supply voltage on receiving what is referred to as a total inhibit control so that the output control signal keeps the switch open irrespective of the input control signal.

The invention allows the switch to be opened independently of the input control signal received by the amplifier, and therefore independently of whether or not the device supplying this input control signal is operating correctly. Thus, in the case of a switching arm, it is always possible to open the two switches.

Optionally, the inhibiting device is designed to short the supply terminals of the amplifier on receiving the total inhibit control.

Also optionally, the inhibiting device comprises a controllable shorting switch having a current input terminal connected to the positive supply terminal, a current output terminal connected to the negative supply terminal, and a control terminal, the total inhibit control being in the form of a voltage between the control terminal and the current output terminal.

Also optionally, the control system moreover comprises a level shifter designed to receive the total inhibit control in the form of a voltage with respect to a voltage reference different than the negative terminal of the amplifier and to provide the total inhibit control to the inhibiting device in the form of a voltage with respect to the negative terminal of the amplifier.

Also optionally, the control system moreover comprises a capacitor connected between the positive and negative terminals of the amplifier in order to provide the supply voltage.

Also optionally, the control system moreover comprises a charging device for the capacitor.

A switching arm system for a voltage converter is also proposed, comprising:
a high-side switch,
a low-side switch,
a control system for one of the high-side and low-side switches, according to the invention,
in which the high-side switch and the low-side switch are connected to one another at a midpoint intended to be connected to one phase of a rotating electrical machine.

Optionally, the switching arm system moreover comprises a control system for the other of the high-side and low-side switches, according to the invention.

Also optionally, the switching arm system comprises a single reception input for the total inhibit control intended both for the control system for the high-side switch and for the control system for the low-side switch.

DESCRIPTION OF THE FIGURES

FIG. 1 is a simplified circuit diagram of an electrical system 100 according to the invention comprising a DC voltage source, a rotating electrical machine and a voltage converter interposed between them.

FIG. 3 is a circuit diagram illustrating the elements of the control system allowing a switch of the voltage converter to be opened, independently of the control signals for this switch.

DETAILED DESCRIPTION

Figure 2:
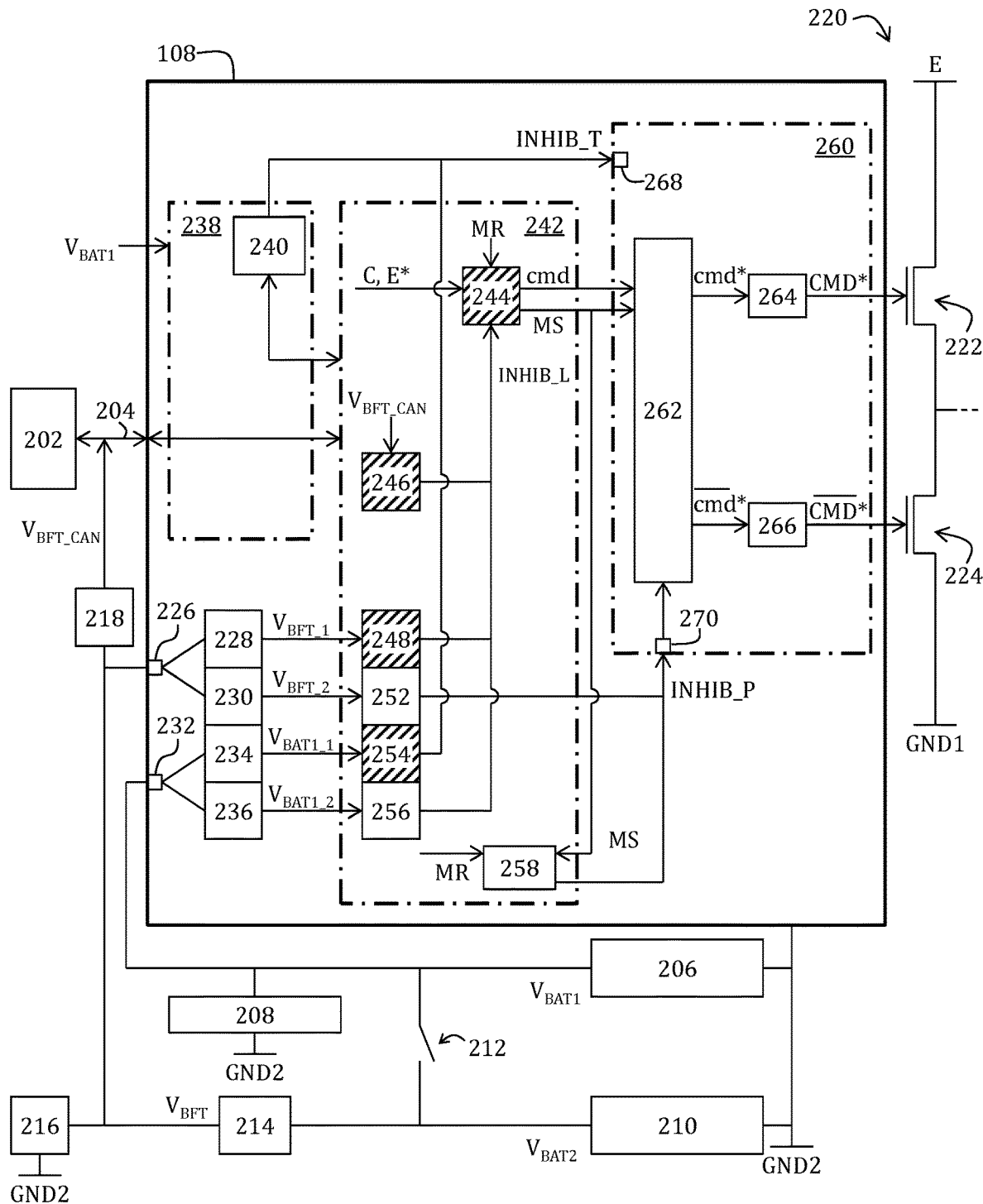
FIG. 2 is a block diagram of a control system for the voltage converter of FIG. 1.

Referring to FIG. 1, an electrical system 100 according to the invention will now be described. The electrical system 100 is intended to be implemented in an automotive vehicle, for example.

The electrical system 100 first of all comprises a DC voltage source 102 comprising a positive terminal and a negative terminal, the latter commonly being connected to an electrical ground, denoted GND1 in the figures, such as a chassis of the automotive vehicle. The DC voltage source 102 is designed to provide a DC input voltage E between these terminals, having a value of around 12 V, for example.

The electrical system 100 moreover comprises a rotating electrical machine 104 comprising stator phases U, V, W, respective first ends of which are connected to the same neutral point N in the example described. In the example described, the rotating electrical machine 104 is part of an alternator-starter coupled to an internal combustion engine (not shown) of the automotive vehicle. The rotating electrical machine 104 is thus designed to operate alternately in motor mode, in which it assists the internal combustion engine, and in alternator mode, in which it transforms some of the mechanical energy generated by the internal combustion engine into electrical energy for recharging the DC voltage source 102.

The electrical system 100 moreover comprises a voltage converter 106 connected firstly to the terminals of the DC voltage source 102 and secondly to the rotating electrical machine 104.

The voltage converter 106 comprises switching arms respectively associated with the stator phases U, V, W. Each switching arm comprises a high-side switch connected to the positive terminal of the DC voltage source 102 and a low-side switch connected to the negative terminal of the DC voltage source 102. The high-side switch and the low-side switch are moreover connected to one another at a midpoint connected to the associated stator phase U, V, W. Each switching arm is intended to be controlled to change over between two configurations. In the first, referred to as high configuration, the high-side switch is closed and the low-side switch is open so that the input voltage E is applied to a second end of the associated stator phase U, V, W. In the second, referred to as low configuration, the high-side switch is open and the low-side switch is closed so that a zero voltage is applied to the second end of the associated stator phase U, V, W.

The voltage converter 106 is intended to be controlled to change over each arm between these two configurations, so as to provide electric power to the rotating electrical machine 104 when it is required to operate in motor mode and to provide electric power to the DC voltage source 102 when the rotating electrical machine 104 is required to operate in alternator mode.

Thus, the electrical system 100 moreover comprises a control system 108 for the voltage converter 106, which will be described in detail below.

Referring to FIG. 2, the electrical system 100 moreover comprises an electronic control unit (ECU) 202 and a data bus 204, in the example described a CAN (controller area network) data bus interconnecting the electronic control unit 202 and the control system 108.

The electrical system 100 moreover comprises a DC voltage source 206 designed to provide a DC voltage $V_{BAT1}$ with respect to an electrical ground, denoted GND2 in the figures and commonly connected to the chassis of the automotive vehicle. In the example described, the DC voltage source 206 comprises an Li-ion battery and the voltage $V_{BAT1}$ has a value of around 12 V, for example. The voltage source 102 providing the voltage E uses the voltage source 206, for example, so that the voltage E is derived from the voltage $V_{BAT1}$.

The electrical system 100 moreover comprises a starter 208 designed to assist the internal combustion engine of the automotive vehicle to start when the alternator-starter is unable to do so, for example when the temperature of the internal combustion engine is too low.

The electrical system 100 moreover comprises a DC voltage source 210 designed to provide a DC voltage $V_{BAT2}$ with respect to the electrical ground GND2. In the example described, the DC voltage source 210 comprises a lead acid battery and the voltage $V_{BAT2}$ has a value of around 12 V, for example.

The electrical system 100 moreover comprises a controllable switch 212 intended, when closed, to connect the two DC voltage sources 206, 210 to one another so that they cooperate to provide sufficient current to the starter 208 for it to be able to operate.

The electrical system 100 moreover comprises a battery fuse terminal (BFT) 214 connected to the DC voltage source 210 in order to provide a voltage $V_{BFT}$, which is substantially equal to the voltage $V_{BAT2}$ and therefore has a value of around 12 V in the example described.

The electrical system 100 moreover comprises electrical components 216 connected to the battery fuse terminal 214 in order to receive the voltage $V_{BFT}$ and thus to be supplied with electric power.

The battery fuse terminal 214 comprises at least one fuse (not shown) intended to break the connection to the DC voltage source 210 when the current passing through this fuse becomes too large, for example in the event of a short in one of the electrical components 216.

The electrical system 100 moreover comprises a voltage sensor 218 designed to provide a measurement $V_{BFT\_CAN}$ of the voltage $V_{BFT}$ on the data bus 204.

The control system 108 will now be described in more detail for the control of a switching arm of the voltage converter 106 in FIG. 1. This switching arm, denoted by the reference 220, comprises, as explained above with reference to FIG. 1, a high-side switch, denoted by the reference 222, and a low-side switch, denoted by the reference 224. The high-side switch 222 has a current input terminal connected to the positive terminal of the DC voltage source 102 and a current output terminal connected to the midpoint between the switching arm 220 and a control terminal. The low-side switch 224 has a current input terminal connected to the midpoint, a current output terminal connected to the electrical ground GND1 and a control terminal.

The control system 108 first of all comprises an input 226 connected to the battery fuse terminal 214 in order to receive the voltage $V_{BFT}$.

The control system 108 moreover comprises two sensors 228, 230 connected to the input 226 and designed to respectively provide two measurements $V_{BFT\_1}$, $V_{BFT\_2}$ of the voltage $V_{BFT}$.

The control system 108 moreover comprises an input 232 connected to the DC voltage source 206 in order to receive the voltage $V_{BAT1}$.

The control system 108 moreover comprises two sensors 234, 236 connected to the input 232 and designed to respectively provide two measurements $V_{BAT1\_1}$, $V_{BFT1\_2}$ of the voltage $V_{BAT1}$.

The control system 108 moreover comprises a microcontroller 242 and a driver 260, which will now be described. By way of example, there is provision for one driver (similar to the driver 260) for each switching arm of the voltage converter 106 and a single microcontroller 242 for all the drivers.

As is known per se, the microcontroller 242 is a computing device equipped with a processing unit and a main memory (which are not shown). One or more computer programs are recorded in the main memory and intended to be executed by the processing unit in order to implement the devices that will now be described.

Thus, the microcontroller 242 first of all implements a control-establishing device 244.

The control-establishing device 244 is first of all designed to receive, from the data bus 204, a mode request, denoted MR in the figures, indicating the mode in which the voltage converter 106 needs to be controlled: alternator mode or else motor mode. The control-establishing device 244 is thus designed to operate either in motor mode or in alternator mode according to the mode request MR received from the data bus 204.

The control-establishing device 244 is designed to establish controls, denoted cmd in the figures, destined for the driver 260, these controls cmd being adapted for the mode that it is in. More precisely, in motor mode, the control-establishing device 244 is designed to establish the controls cmd from a target torque C desired at the end of a shaft of the rotating electrical machine 104. In alternator mode, the control-establishing device 244 is designed to establish the controls cmd on the basis of a target voltage E* for the voltage E. The target torque C and the target voltage E* are received from the data bus 204, for example.

The control-establishing device 244 is moreover designed to transmit the mode request MR to the driver 260. To distinguish the received mode request MR from the transmitted one, the latter is called mode select and denoted MS in the figures.

The control-establishing device 244 is moreover designed, as long as it receives an inhibit control, referred to as a software control and denoted INHIB_L, to provide the driver 260 with controls cmd intended to cause the switches 222, 224 to open independently of the instructions received (C, E*).

The microcontroller 242 moreover implements a watchdog 246 for the measurement $V_{BFT\_CAN}$, designed to provide a software inhibit control INHIB_L to the control-establishing device 244 when the measurement $V_{BFT\_CAN}$ is below a predefined threshold. In the example described, this predefined threshold is between 8 V and 11 V, for example 10.8 V.

The microcontroller 242 moreover implements a watchdog 248 for the measurement $V_{BFT\_1}$, designed to provide a software inhibit control INHIB_L to the control-establishing device 244 when the measurement $V_{BFT\_1}$ is below a predefined threshold. In the example described, this predefined threshold is between 8 V and 11 V, for example 10.8 V.

The microcontroller 242 moreover implements a watchdog 252 for the measurement $V_{BFT\_2}$, designed to provide what is referred to as a partial inhibit control denoted INHIB_P to the driver 260 when the measurement $V_{BFT\_2}$ is below a predefined threshold. In the example described, this predefined threshold is between 8 V and 11 V, for example 10.8 V.

The microcontroller 242 moreover implements a watchdog 254 for the measurement $V_{BAT1\_1}$, designed to provide what is known as a total inhibit control denoted INHIB_T to the driver 260 when the measurement $V_{BAT1\_1}$ is below a predefined threshold. In the example described, this predefined threshold is between 5 V and 8 V, for example 5.5 V.

The microcontroller 242 moreover implements a watchdog 256 for the measurement $V_{BAT1\_2}$, designed to provide a software inhibit control INHIB_L to the control-establishing device 244 when the measurement $V_{BAT1\_2}$ is below a predefined threshold. In the example described, this predefined threshold is between 5 V and 8 V, for example 5.5 V.

It will be appreciated that the predefined threshold for the measurements of the voltage $V_{BFT}$ is higher than the predefined threshold for the measurements of the voltage $V_{BAT1}$. Indeed, an Li-ion battery risks catching fire and/or releasing toxic gases in the event of undervoltage, even an insignificant one. On the other hand, such a risk is very moderate for a lead acid battery, such that a more significant undervoltage can be tolerated.

The microcontroller 242 moreover implements an unintentional-starting detection device 258. There is a risk of unintentional starting occurring in the event of a fault in the microcontroller 242. In this case, the faulty microcontroller 242 risks changing to motor mode and sending the driver 260 a mode select MS indicating a change to motor mode while the mode request MR received indicates use of the alternator mode (the automotive vehicle is stopped). Thus, the unintentional-starting detection device 258 is designed to detect when the mode select MS indicates a motor mode while the mode request MR indicates an alternator mode. In this case, the unintentional-starting detection device 258 is designed to send a partial inhibit control INHIB_P to the driver 260.

In order to ensure that the unintentional-starting detection device 258 does indeed receive the mode select MS sent by the microcontroller 242, the unintentional-starting detection device 258 is designed to monitor an input pin of the microcontroller 242 that is connected to an output pin of the microcontroller 242 that is connected to the driver 260 and has the mode select MS.

In addition, in the example described, the microcontroller 242 has two levels of execution, at least parts of which are structurally separate, called functional level and monitoring level. The devices 244, 246, 248, 254 are implemented in the functional level of the microcontroller 242, as indicated in FIG. 2 by hatching, whereas the devices 252, 256, 258 are implemented in the monitoring level of the microcontroller 242, as indicated in FIG. 2 by the absence of hatching. The structural separation can use two mechanisms (which can be implemented at the same time). According to the first mechanism, the processing unit comprises two distinct cores that are respectively dedicated to the two levels. Thus, the microcontroller 242 is designed so that the devices of each of the two levels are executed exclusively by the core associated with this level and not by the other core. According to the second mechanism, two predefined memory ranges of the main memory are respectively dedicated to the two levels. Thus, the microcontroller 242 is designed so that the devices of each of the two levels use exclusively the memory range associated with this level and not the other memory range.

The control system 108 moreover comprises a watchdog 240 of the microcontroller 242. This watchdog 240 is designed to provide a total inhibit control INHIBIT_T to the driver 260 in the event of detection of a fault in the microcontroller 242.

The driver 260 will now be described in more detail. In the example described, at least part of the driver 260 is implemented by an application-specific integrated circuit (ASIC).

The driver 260 comprises a control management device 262 and two amplifiers, high-side 264 and low-side 266, respectively.

The control management device 262 is designed to receive the controls cmd from the microcontroller 242 and to provide input control signals cmd*, $\overline{cmd}$* to the two amplifiers 264, 266, respectively, from the controls cmd. The input control signals cmd*, $\overline{cmd}$* are substantially complementary with respect to one another. The input control signals cmd, $\overline{cmd}$* are amplified by the amplifiers 264, 266, respectively, in order to obtain output control signals CMD*, $\overline{CMD}$*, respectively, which are provided to the switches 222, 224, so that the rotating electrical machine 104 is able to operate in motor mode or in alternator mode according to the mode in which the microcontroller 242 operates.

The control management device 262 is moreover designed to receive a partial inhibit control INHIB_P and, as long as the partial inhibit control INHIB_P is received, to operate in what is known as a degraded alternator mode, in which the control management device 262 is designed to establish the input control signals cmd*, $\overline{cmd}$* provided to the amplifiers 264, 266 itself, that is to say independently of the controls cmd and of the mode select MS that are received from the microcontroller 242. The input control signals cmd*, $\overline{cmd}$* are again amplified by the amplifiers 264, 266 in order to obtain the output control signals CMD*, $\overline{CMD}$*, respectively, which are provided to the switches 222, 224, so that the rotating electrical machine 104 is able to operate in alternator mode.

The driver 260 moreover comprises a partial inhibit input 270 connected to the devices 252, 258 so as to receive the partial inhibit control INHIB_P provided by any one of these devices 252, 258. This partial inhibit input 270 is moreover connected to the control management device 262 of the driver 260 in order to provide the latter with each partial inhibit control INHIB_P received, so as to change to degraded alternator mode.

The driver 260 moreover comprises a total inhibit input 268 connected to the watchdogs 254, 240 so as to receive the total inhibit control INHIB_T provided by any one of these devices 254, 240. As long as a total inhibit control INHIB_T is received on the total inhibit input 268, the driver 260 is designed to provide output control signals CMD*, $\overline{\text{CMD}}$* keeping the switches 222, 224 open, independently of the controls cmd received from the microcontroller 242. The way in which this function is performed will be explained later on with reference to FIG. 3.

The control system 108 moreover comprises a system basis chip (SBC) 238 connected to the data bus 204 and to the DC voltage source 206 (for example via the input 232) in order to receive the voltage $V_{BAT1}$. The system basis chip 238 is designed to perform several functions, including providing one or more supply voltages, in particular for the microcontroller 242 and for the driver 260, from the voltage $V_{BAT1}$, transmitting messages between the data bus 204 and the microcontroller 242 and monitoring the microcontroller 242. In order to perform the latter function, the system basis chip 238 comprises the watchdog 240.

It will be appreciated that the voltage $V_{BAT1}$ is used to supply power to the driver 260 and the microcontroller 242. Thus, the undervoltage of the voltage $V_{BAT1}$ is a critical fault for the control system 108. This is the reason the watchdog 254 provides a total inhibit control INHIB_T intended to keep the switches 222, 224 open all the time. On the other hand, an undervoltage of the voltage $V_{BFT}$ is less critical (for the control system 108 at any rate), such that the degraded alternator mode can be kept. This is the reason the inhibit control of the device 252 is provided to the partial inhibit input 270 of the driver 260.

The elements performing the total inhibit function will now be described with reference to FIG. 3.

As illustrated in FIG. 3, the high-side amplifier 264, or the low-side amplifier 266, is designed to receive the input control signal cmd*, or $\overline{\text{cmd}}$*, in order to amplify this input control signal cmd*, or $\overline{\text{cmd}}$*, to obtain the output control signal CMD*, or $\overline{\text{CMD}}$*, and to apply the output control signal CMD*, or $\overline{\text{CMD}}$*, to the high-side switch 222, or the low-side switch 224, in order to either open or close it.

Each amplifier 264, 266 has two, positive (denoted+ in FIG. 3) and negative (denoted− in FIG. 3), supply terminals intended to receive a supply voltage for this amplifier 264, 266. The negative supply terminal is connected to the current output terminal of the high-side amplifier 222, or low-side amplifier 224.

The driver 260 moreover comprises two bootstrap capacitors 302, 304 connected between the positive and negative terminals, respectively, of the amplifiers 264, 266 in order to provide the respective supply voltages.

The driver 260 moreover comprises two charging devices 306, 308 for charging the two bootstrap capacitors 302, 304, respectively, from a voltage, the voltage $V_{BAT1}$ in the example described. The charging device 306 comprises a charge pump, for example. The latter comprises for example a capacitor 309 connected to the voltage $V_{BAT1}$ and to the capacitor 302 via four switches 311$_1$, 311$_2$, 311$_3$, 311$_4$. These are controlled in order to alternately connect the capacitor 309 to the voltage $V_{BAT1}$ and to the bootstrap capacitor 302.

The charging device 308 comprises for example a diode 313 allowing current to flow from the voltage $V_{BAT1}$ to the bootstrap capacitor 304.

The driver 260 moreover comprises an inhibiting device 310 for the high-side amplifier 264. The inhibiting device 310 is connected to the total inhibit input 268 in order to receive a total inhibit control INHIB_T and is designed to lower the supply voltage between the supply terminals of the high-side amplifier 364 on receiving the total inhibit control INHIB_T, so that the output control signal CMD* causes the high-side switch 222 to open, irrespective of the input control signal cmd* received.

In the example described, the inhibiting device 310 is designed to short the supply terminals of the high-side amplifier 264 on receiving the total inhibit control INHIB_T, which discharges the bootstrap capacitor 302 and lowers the supply voltage for the high-side amplifier 264. By way of example, the inhibiting device 310 is designed to cancel this supply voltage. The reduction in the supply voltage brings about a reduction in the output control signal CMD*, so that at one time this output control signal CMD* is no longer sufficient, even at its maximum, to cause the high-side switch 222 to close. Said switch thus remains open.

More precisely, in the example described, the inhibiting device 310 comprises a controllable shorting switch, having a current input terminal connected to the positive supply terminal, a current output terminal connected to the negative supply terminal, and a control terminal. Moreover, the driver 260 comprises a level shifter 312 connected between the total inhibit input 268 and the inhibiting device 310. The controllable shorting switch is for example a metal oxide semiconductor field effect transistor (MOSFET).

Each total inhibit control INHIB_T applied to the total inhibit input 268 is in the form of a voltage with respect to the electrical ground GND2. The level shifter 312 is designed to receive this voltage and to shift it so as to provide the total inhibit control INHIB_T in the form of a voltage between the control terminal of the controllable shorting switch and the negative terminal of the high-side amplifier 264.

Similarly, to inhibit the low-side amplifier 266, the driver 260 comprises an inhibiting device 314 and a level shifter 316.

Based on the above, it appears that the total inhibit function of the switches 222, 224 is independent of the input control signals cmd*, $\overline{\text{cmd}}$* received by the amplifiers 264, 266. Thus, in the event of a fault in the control management device 262, it is still possible to open the two switches 222, 224. Moreover, the solution described uses a reduced number of components, which are simpler components, so that inhibiting is rapid. In the example described, the time between the application of a total inhibit control INHIB_T to the total inhibit input 268 and the effective inhibiting of the amplifiers 264, 266 is less than 500 μs, for example 400 μs. The delay generally required between the occurrence of a fault and the opening of the switches 222, 224 is around 1 ms. Thus, the delay of 400 μs for implementing the inhibit control leaves 600 μs for detection of the fault, which is generally sufficient.

The present invention is not limited to the embodiment described above. Indeed it will be apparent to a person skilled in the art that modifications can be made thereto.

By way of example, at least one of the watchdogs 252, 254 could be realized outside the microcontroller 242, in one or more prewired components (that is to say not implementing a computer program).

Moreover, generally, each of the watchdogs 246, 248, 252, 254, 256 can be connected either to the total inhibit input 268 in order to cause the switches 222, 224 to open (whether the microcontroller 242 is in motor mode or else in alternator mode) or to the partial inhibit input 270 in order to change the driver to degraded alternator mode.

In addition, the terms used should not be understood to be limited to the elements of the embodiment described above, but rather should be understood to cover all equivalent elements that a person skilled in the art is able to deduce from his general knowledge.

The invention claimed is:

1. A control system for a switch, comprising:
    an amplifier configured to receive an input control signal, in order to amplify the input control signal so as to obtain an output control signal and to apply the output control signal to the switch to either open or close the switch,
    the amplifier having two, positive and negative, supply terminals configured to receive a supply voltage,
    an inhibiting device for the amplifier configured to lower the supply voltage on receiving a total inhibit control so that the output control signal keeps the switch open irrespective of the input control signal.

2. The control system as claimed in claim 1, in which the inhibiting device is designed is configured to short the supply terminals of the amplifier on receiving the total inhibit control.

3. The control system as claimed in claim 1, in which the inhibiting device comprises a controllable shorting switch having a current input terminal connected to the positive supply terminal, a current output terminal connected to the negative supply terminal, and a control terminal, the total inhibit control being in the form of a voltage between the control terminal and the current output terminal.

4. The control system as claimed in claim 1, further comprising a level shifter configured to receive the total inhibit control in the form of a voltage with respect to a voltage reference different than the negative terminal of the amplifier and to provide the total inhibit control to the inhibiting device in the form of a voltage with respect to the negative terminal of the amplifier.

5. The control system as claimed in claim 1, further comprising a capacitor connected between the positive and negative terminals of the amplifier in order to provide the supply voltage.

6. The control system as claimed in claim 5, further comprising a charging device for the capacitor.

7. A switching arm system for a voltage converter, comprising:
    a high-side switch,
    a low-side switch,
    a control system for one of the high-side and low-side switches as claimed in claim 1,
    wherein the high-side switch and the low-side switch are connected to one another at a midpoint intended to be connected to one phase of a rotating electrical machine.

8. The switching arm system as claimed in claim 7, further comprising a control system for the other of the high-side and low-side switches.

9. The switching arm system as claimed in claim 8, further comprising a single reception input for the total inhibit control intended both for the control system for the high-side switch and for the control system for the low-side switch.

* * * * *